United States Patent
Xin et al.

(10) Patent No.: US 9,683,103 B2
(45) Date of Patent: Jun. 20, 2017

(54) POLYMERIC DYE COMPOUND, PHOTOSENSITIVE RESIN COMPOSITION COMPRISING SAME AND USE THEREOF

(71) Applicant: BOE TECHNOLOGY GROUP CO., LTD., Beijing (CN)

(72) Inventors: Yangyang Xin, Beijing (CN); Chen Liu, Beijing (CN); Jianchao Lun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 249 days.

(21) Appl. No.: 14/570,065

(22) Filed: Dec. 15, 2014

(65) Prior Publication Data

US 2015/0344696 A1 Dec. 3, 2015

(30) Foreign Application Priority Data

Jun. 3, 2014 (CN) .......................... 2014 1 0242267

(51) Int. Cl.

| | |
|---|---|
| G02B 5/20 | (2006.01) |
| G03F 7/004 | (2006.01) |
| C09B 69/10 | (2006.01) |
| G03F 7/038 | (2006.01) |
| G02B 1/04 | (2006.01) |
| G02B 5/23 | (2006.01) |
| G02B 5/22 | (2006.01) |
| G03F 7/00 | (2006.01) |
| G03F 7/027 | (2006.01) |
| G03F 7/031 | (2006.01) |
| G03F 7/033 | (2006.01) |
| G03F 7/105 | (2006.01) |

(52) U.S. Cl.
CPC ............... *C09B 69/10* (2013.01); *G02B 1/04* (2013.01); *G02B 5/223* (2013.01); *G02B 5/23* (2013.01); *G03F 7/0007* (2013.01); *G03F 7/027* (2013.01); *G03F 7/031* (2013.01); *G03F 7/033* (2013.01); *G03F 7/0388* (2013.01); *G03F 7/105* (2013.01)

(58) Field of Classification Search
CPC ........ G03F 7/0007; G03F 7/033; G03F 7/031; G03F 7/105; G03F 7/028; G03F 7/027; G02B 5/223; C09B 69/10; C09B 69/103; C09B 69/106; C09B 69/109

USPC ........................................................... 430/7
See application file for complete search history.

(56) References Cited

U.S. PATENT DOCUMENTS 6,509,125 B1 * 1/2003 Ito .......................... G02B 5/201
349/106
2007/0117031 A1 * 5/2007 Mizukawa ............ C08F 220/28
430/7

FOREIGN PATENT DOCUMENTS

| CN | 102307914 A | 1/2012 |
|---|---|---|
| CN | 102803459 A | 11/2012 |
| CN | 103135351 A | 6/2013 |
| CN | 103359789 A | 10/2013 |
| CN | 104238267 A | 12/2014 |
| JP | 2000095960 A | 4/2000 |
| KR | 20140106281 A | 4/2014 |
| WO | WO 2010/142503 A1 * | 12/2010 |

OTHER PUBLICATIONS

A. Altomare, et al., "Synthesis of Reactive Polymeric Dyes as Textile Auxiliaries", Macromal. Mater. Eng. 2003, 288, No. 9, pp. 679-692.
Z. Shufen, et al. "Research of Polymeric dyes by Chemical Modification of a Polymer by a Dye", China Academic Journal Electronic Publishing House, http://www.cnki.net.
1st Office Action issued in Chinese application No. 201410242267.1 dated Sep. 11, 2015.

* cited by examiner

*Primary Examiner* — John A McPherson
(74) *Attorney, Agent, or Firm* — Nath, Goldberg & Meyer; Joshua B. Goldberg

(57) ABSTRACT

A polymeric dye compound, photosensitive resin composition comprising the same and use thereof are disclosed. The polymeric dye compound comprises three kinds of monomeric units. The photosensitive resin composition comprises a colorant, an alkali-soluble resin, a polymerizable monomer and a polymerization initiator, wherein the colorant comprises the polymeric dye compound and a pigment. The polymeric dye compound is prepared by copolymerization of styrenic monomer and other monomers, such that a colored layer having excellent heat resistance, light resistance and high transmittance can be formed.

16 Claims, No Drawings

POLYMERIC DYE COMPOUND, PHOTOSENSITIVE RESIN COMPOSITION COMPRISING SAME AND USE THEREOF

FIELD OF THE INVENTION

The present invention relates to the technical field of color liquid crystal display. Particularly, the present invention relates to a polymeric dye compound, a photosensitive resin composition comprising the polymeric dye compound and the use thereof in color filters.

BACKGROUND OF THE INVENTION

With the rapid popularization of flat panel display products such as liquid crystal displays (LCDs), organic light emitting diode (OLED) displays and the like, the requirements for color display are increasingly improved. Color filters are critical components for the flat panel display products such as LCD panels and OLEDs to achieve colorful display.

A coloring photosensitive resin composition is a photosensitive resin composition comprising coloring pigment(s), which is useful for forming color patterns (including red, green, blue, yellow, orange, black, etc.) of color filters. There are many methods for preparation of color filters, such as dyeing process, pigment dispersion process, printing process, etc. The pigment dispersion process comprises the steps of: coating a coloring photosensitive resin composition onto a color glass substrate provided with a black matrix; performing photolithography including exposure and development to form the first color pattern of a color filter, followed by treatment including heating; repeating the steps described above to form all the color patterns of the color filter; and finally forming a conductive layer of indium tin oxide, thereby the finished color filter having multi-color patterns can be obtained.

Since color filters for flat panel display products are desired to exhibit relatively high transmittance and low light-scattering, the coloring photosensitive resin compositions for preparing the color filters should have stable dispersions of particles and particle size distributions. Conventional coloring photosensitive resin compositions useful for the color filters typically comprise unsaturated carboxylic acids or carboxylic anhydrides, resins comprising ethylenically unsaturated double bonds and epoxy groups, pigments, dispersants, photoinitiators, solvents, etc. However, such coloring photosensitive resin compositions encounter some problems. For example, the viscosity of the coloring photosensitive resin compositions increases and the flowability thereof decreases, post-thickening phenomenon occurs over time, curing may be insufficient, and so on. In return, the surface characteristics of the resulting color filters are affected.

There are some reports of photosensitive resin compositions. For example, CN102253599B discloses a salt-forming product prepared from a xanthene-based acidic dye and a cationic group-containing compound. The product may overcome the shortcomings of acidic dyes including poor heat resistance, light resistance, and solvent resistance, and may improve the transmittance of color filters.

SUMMARY OF THE INVENTION

In order to seek a high brightness and wide color reproduction area, the inventors provide a new coloring composition useful for color filters, wherein the composition has a high transmittance, as well as excellent heat resistance, light resistance and solvent resistance. Also provided is a color filter having a high transmittance, as well as excellent heat resistance, light resistance and solvent resistance which is prepared from the coloring composition.

The coloring composition is a photosensitive resin composition comprising a colorant, an alkali-soluble resin, a polymerizable monomer and a polymerization initiator (particularly, a photoinitiator), wherein the colorant comprises a polymeric dye compound and a pigment. The polymeric dye compound comprises three kinds of monomeric units. Since the polymeric dye compound is prepared by copolymerization of styrenic monomer and other monomers, a colored layer having excellent heat resistance, light resistance and high transmittance can be formed from the compound.

The present invention also provides a method of preparing the polymeric dye compound, comprising the following steps:

1) dissolving and reacting an acyl chloride group-containing ethylenically unsaturated monomer and a basic dye in a non-reactive organic solvent to produce an amide compound; and
2) mixing the amide compound obtained in step 1), an ethylenically unsaturated monomer having a carboxyl group or a carboxylic anhydride structure, an ethylenically unsaturated monomer having an aromatic functional group and a solvent under stirring, followed by the addition of a radical polymerization initiator to initiate a polymerization reaction, thereby producing the polymeric dye compound.

DETAILED DESCRIPTION OF CERTAIN EMBODIMENTS

The present invention provides a polymeric dye compound, comprising monomeric units (A), (B) and (C) represented by the following structural formulae:

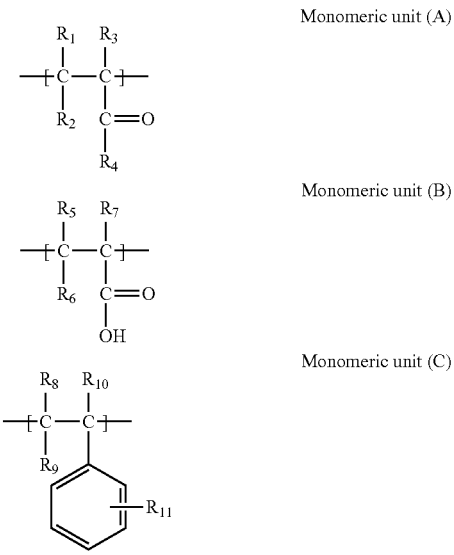

In the structural formulae, $R_1$, $R_2$, $R_3$, $R_8$, $R_9$, $R_{10}$ and $R_{11}$ each independently represent hydrogen, halogen, C1-C12 alkyl, C3-C12 cycloalkyl, or C6-C12 aromatic hydrocarbyl.

$R_4$ is a group derived from a basic dye and connected to the monomeric unit (A) via a nitrogen atom. The basic dye may be selected according to the desired properties of the product. Preferably, the basic dye is selected from the group consisting of Basic Red 9, Basic Red 29, Basic Blue 11, Basic Blue 17, Basic Blue 26, Basic Red 2 and Basic Violet 2.

$R_5$, $R_6$ and $R_7$ each independently represent hydrogen, halogen, carboxyl, C1-C12 alkyl, or carboxyalkyl. The carboxyl group contained in $R_5$, $R_6$ or $R_7$, if any, may optionally form a carboxylic anhydride structure with the carboxyl group present in the structural formula of the monomeric monomer (B).

When a carboxyl group is contained in any one of $R_5$ and $R_6$ and forms a carboxylic anhydride structure with the carboxyl group present in the structural formula of the monomeric monomer (B), the structure corresponds to the following formula:

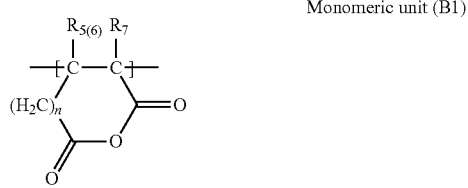

Monomeric unit (B1)

wherein $R_{5(6)}$ is the one of $R_5$ and $R_6$ that does not participate in forming a carboxylic anhydride structure, $(H_2C)_n$ represents an alkylene, wherein n is an integer of 0-11.

In particular, when $R_5$ or $R_6$ is a carboxyl group, i.e., n=0, the above structure corresponds to the following formula:

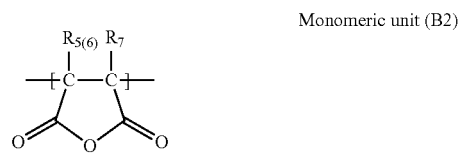

Monomeric unit (B2)

Similarly, when a carboxyl group is contained in $R_7$ and forms a carboxylic anhydride structure with the carboxyl group present in the structural formula of the monomeric monomer (B), the structure corresponds to the following formula:

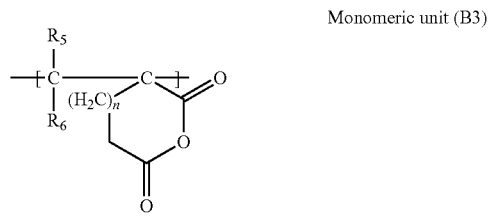

Monomeric unit (B3)

wherein $(H_2C)_n$ represents an alkylene and n is an integer of 0-11.

In particular, when $R_7$ is a carboxyl group, i.e., n=0, the above structure corresponds to the following formula:

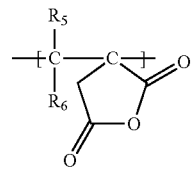

Monomeric unit (B4)

As used herein, the term "halogen" refers to fluorine, chlorine, bromine or iodine, and preferably chlorine.

As used herein, the term "C1-C12 alkyl" refers to an unsubstituted, saturated linear or branched alkyl group having 1 to 12 carbon atoms, for example, an unsubstituted, saturated linear or branched alkyl group having 1-10 carbon atoms, 1-8 carbon atoms, 1-6 carbon atoms, or 1-3 carbon atoms, preferably an unsubstituted, saturated linear alkyl group having 1-3 carbon atoms such as methyl, ethyl or propyl, and even more preferably methyl.

As used herein, the term "carboxyalkyl" refers to an alkyl bonded with a carboxyl group. Typically, the alkyl with reference to a carboxyalkyl is an unsubstituted, saturated linear or branched alkyl group having 1 to 11 carbon atoms, for example, an unsubstituted, saturated linear or branched alkyl group having 1-10 carbon atoms, 1-8 carbon atoms, 1-6 carbon atoms, or 1-3 carbon atoms, preferably an unsubstituted, saturated linear alkyl group having 1-3 carbon atoms such as methyl, ethyl or propyl.

As used herein, the term "C3-C12 cycloalkyl" refers to an unsubstituted, saturated alicyclic hydrocarbyl having 3-12 carbon atoms, preferably an unsubstituted, saturated alicyclic hydrocarbyl having 3-8 carbon atoms, and more preferably an unsubstituted, saturated alicyclic hydrocarbyl having 3-6 carbon atoms, and most preferably an unsubstituted, saturated alicyclic hydrocarbyl having 6 carbon atoms, i.e., cyclohexyl.

As used herein, the term "C6-C12 aromatic hydrocarbyl" refers to an aryl group having a total of 6-12 carbon atoms (i.e., phenyl or naphthyl), an alkylaryl group having a total of 6-12 carbon atoms, or an arylalkyl group having a total of 6-12 carbon atoms.

It should be noted that the polymeric dye compound is a random copolymer which may optionally comprise any other monomeric units commonly used in the art. During polymerization, the monomeric units (A), (B), (C), and optionally the any other monomeric units are connected randomly to form a polymeric chain. In the polymeric dye compound, the sum of the monomeric units (A), (B) and (C) is in the range of 80-100 mol %, for example, 80 mol %, 83 mol %, 86 mol %, 90 mol %, 93 mol %, 96 mol %, 98 mol % or 100 mol %, preferably 100 mol %, based on the total monomeric units of the polymeric dye compound.

The molar ratio of the monomeric units (A):(B):(C) is 1:1-10:1-10, for example, 1:1:1, 1:3:1, 1:5:1, 1:8:1, 1:10:1, 1:1:3, 1:3:3, 1:5:3, 1:8:3, 1:10:3, 1:1:5, 1:3:5, 1:5:5, 1:8:5, 1:10:5, 1:1:8, 1:3:8, 1:5:8, 1:8:8, 1:10:8, 1:1:10, 1:3:10, 1:5:10, 1:8:10, 1:10:10, etc., preferably 1:1-7:1-5, and more preferably 1:5:3.

The polymeric dye compound has a weight-average molecular weight (Mw) in the range of 2,000-20,000, for example, 3,000, 4,000, 5,000, 6,000, 7,000, 8,000, 9,000, 10,000, 11,000, 12,000, 13,000, 14,000, 15,000, 16,000, 17,000, 18,000, 19,000, or 20,000, preferably 5,000-15,000, and more preferably 7,000-9,000.

In a preferred embodiment, the polymeric dye compound satisfies one or more selected from the group consisting of the following: $R_1$, $R_2$, $R_3$, $R_5$, $R_6$, $R_7$, $R_8$, $R_9$, $R_{10}$ and $R_{11}$ each independently represent hydrogen, chlorine, methyl, ethyl, propyl or cyclohexyl; $R_4$ is a group derived from Basic Red 9; the molar ratio of the monomeric units (A):(B):(C) is 1:5:3; and the polymeric dye compound has a weight-average molecular weight (Mw) in the range of 5,000-15,000.

In an alternative embodiment, each of $R_1$, $R_2$, $R_3$, $R_5$, $R_6$, $R_7$, $R_8$, $R_9$, $R_{10}$ and $R_{11}$ is a hydrogen atom. In another embodiment, each of $R_1$, $R_2$, $R_3$, $R_5$, $R_{10}$ and $R_{11}$ is a methyl, and each of $R_6$, $R_7$, $R_8$ and $R_9$ is a hydrogen atom. In another embodiment, each of $R_1$, $R_2$ and $R_3$ is a methyl, $R_7$ is a chlorine atom, and each of $R_5$, $R_6$, $R_8$, $R_9$, $R_{10}$ and $R_{11}$ is a hydrogen atom. In yet another embodiment, each of $R_1$, $R_2$, $R_3$, $R_5$ and $R_{10}$ is a methyl, $R_6$ is a carboxyl group, and each of $R_7$, $R_8$, $R_9$ and $R_{11}$ is a hydrogen atom.

Further, in order to avoid adverse influence on the development performance of the resultant photoresist, the acid value of the polymeric dye compound may be controlled in the range of 50-200 mg/g, for example, 50 mg/g, 70 mg/g, 80 mg/g, 90 mg/g, 100 mg/g, 110 mg/g, 120 mg/g, 140 mg/g, 160 mg/g, 180 mg/g, or 200 mg/g, preferably 80-120 mg/g.

The present invention also provides a method of preparing the polymeric dye compound, comprising the following steps:

1) dissolving and reacting an acyl chloride group-containing ethylenically unsaturated monomer and a basic dye in a non-reactive organic solvent to produce an amide compound (filtration and rotary evaporation may be optionally performed after the reaction, as desired); and 2) mixing the amide compound obtained in step 1), an ethylenically unsaturated monomer having a carboxyl group or a carboxylic anhydride structure, an ethylenically unsaturated monomer having an aromatic functional group and a solvent under stirring, followed by the addition of a radical polymerization initiator to initiate a polymerization reaction, thereby producing the polymeric dye compound (after completion of the polymerization, a washing process may be optionally performed, followed by an optional filtration operation, as desired).

According to the method of the present invention, it is preferable that the step 1) may satisfy the following:

reacting the acyl chloride group-containing ethylenically unsaturated monomer and the basic dye at a molar ratio in the range of 3:1-1:3, for example, 3:1, 2:1, 1:1, 1:2 or 1:3, preferably 1:1;

the acyl chloride group-containing ethylenically unsaturated monomer can react with an amine or amino group in the basic dye to give the amide compound; preferably, the acyl chloride group-containing ethylenically unsaturated monomer may be acryloyl chloride, methacryloyl chloride, or derivatives thereof;

the basic dye is a basic dye capable of connecting to the monomeric unit (A) via a nitrogen atom, for example, Basic Red 9, Basic Red 29, Basic Blue 11, Basic Blue 17, Basic Blue 26, Basic Red 2, Basic Violet 2, or any other dye comprising an amine or amino group;

the reaction is performed at a temperature in the range of 5-20° C. for 2-5 hours (h); and/or the non-reactive organic solvent is added in order to dissolve the reactants in the step 1) such that the reactants can react with each other successfully; meanwhile, due to the special nature of the acyl chloride-based reactant, the solvent used should not be reactive with the reactants acyl chloride group-containing ethylenically unsaturated monomer, and the amine or amino group-containing basic dye, as well as the product containing amide. A person skilled in the art can select an appropriate solvent according to the characteristics of the reaction system, which will be used in an amount enough to dissolve the raw materials. Useful solvent includes those inert solvents such as methylene chloride, tetrahydrofuran, triethylamine and the like. Preferably, the non-reactive organic solvent is triethylamine.

Preferably, in the step 2):

the molar ratio of the amide compound obtained in step 1): the ethylenically unsaturated monomer having a carboxyl group or a carboxylic anhydride structure: the ethylenically unsaturated monomer having an aromatic functional group is substantially identical to the molar ratio of the monomeric units (A):(B):(C) in the polymeric dye compound, because in the resultant polymeric dye compound the monomeric unit (A) is derived from the amide compound obtained in step 1), the monomeric unit (B) is derived from the ethylenically unsaturated monomer having a carboxyl group or a carboxylic anhydride structure, and the monomeric unit (C) is derived from the ethylenically unsaturated monomer having an aromatic functional group; in particular, the molar ratio of these three reactants is in the range of 1:1-10:1-10, for example, 1:1:1, 1:3:1, 1:5:1, 1:8:1, 1:10:1, 1:1:3, 1:3:3, 1:5:3, 1:8:3, 1:10:3, 1:1:5, 1:3:5, 1:5:5, 1:8:5, 1:10:5, 1:1:8, 1:3:8, 1:5:8, 1:8:8, 1:10:8, 1:1:10, 1:3:10, 1:5:10, 1:8:10, 1:10:10, etc., preferably 1:1-7:1-5, and more preferably 1:5:3;

the ratio of the volume of the solvent used in the step 2) to the total weight of the three monomers (i.e., the amide compound, the ethylenically unsaturated monomer having a carboxyl group or a carboxylic anhydride structure, and the ethylenically unsaturated monomer having an aromatic functional group) ranges from 10:1 to 1:10 ml/g, for example, 10:1 ml/g, 9:1 ml/g, 8:1 ml/g, 7:1 ml/g, 6:1 ml/g, 5:1 ml/g, 4:1 ml/g, 3:1 ml/g, 2:1 ml/g, 1:1 ml/g, 1:2 ml/g, 1:3 ml/g, 1:4 ml/g, 1:5 ml/g, 1:6 ml/g, 1:7 ml/g, 1:8 ml/g, 1:9 ml/g or 1:10 ml/g, preferably 2:1 ml/g;

the weight ratio of the radical polymerization initiator to the total of the amide compound, the ethylenically unsaturated monomer having a carboxyl group or a carboxylic anhydride structure and the ethylenically unsaturated monomer having an aromatic functional group ranges from 0.1% to 5%, for example, 0.5%, 1.0%, 1.5%, 2.0%, 2.5%, 3.0%, 3.5%, 4.0%, 4.5%, 5.0%, etc.;

the radical polymerization initiator is added as a solution in the solvent, and the initiator solution may be added in batches, for example, in 2-5 batches (in a particular embodiment, the initiator solution is divided into 5 batches, each batch being added every other hour), such that the quality of the product, i.e., the polymeric dye compound, can be controlled;

the polymerization reaction is performed at a temperature typically in the range of 50-120° C., for example, 50° C., 60° C., 70° C., 80° C., 90° C., 100° C., 110° C. or 120° C., preferably 100° C.;

the polymerization reaction is performed for 5-10 h, for example, 5 h, 5.5 h, 6 h, 6.5 h, 7 h, 7.5 h, 8 h, 8.5 h, 9 h, 9.5 h, 10 h, etc.;

the washing process may be carried out by adding toluene and stirring, such that the product can be separated from the reaction system due to the poor solubility of the product in toluene;

the filtration may be carried out by using a filter paper;

the "ethylenically unsaturated monomer having a carboxyl group or a carboxylic anhydride structure" may be an ethylenic monocarboxylic acid, an ethylenic dicarboxylic acid or anhydride thereof, an ethylenic polycarboxylic acid or anhydride thereof; preferably, the ethylenically unsaturated monomer having a carboxyl group or a carboxylic anhydride structure may be acrylic acid, methacrylic acid, crotonic acid, α-chloroacrylic acid, cinnamic acid, maleic acid or anhydride thereof, fumaric acid or anhydride thereof, itaconic acid or anhydride thereof, and citraconic acid or anhydride thereof; more preferably, the ethylenically unsaturated monomer having a carboxyl group or a carboxylic anhydride structure is acrylic acid or methacrylic acid;

the ethylenically unsaturated monomer having an aromatic functional group may be styrene, α-methyl styrene, o-vinyl toluene, p-vinyl toluene or m-vinyl toluene;

the solvent is one selected from ethylene glycol methyl ether, propylene glycol methyl ether, propylene glycol methyl ether acetate and ethyl 3-ethoxypropionate, preferably ethyl 3-ethoxypropionate, or a mixture of at least two thereof; and/or the radical polymerization initiator is 2,2'-azobisisobutyronitrile or dibenzoyl peroxide.

In an exemplary embodiment, the respective reactants for preparation of the polymeric dye compound may be selected independently as below: acryloyl chloride used as the acyl chloride group-containing ethylenically unsaturated monomer, Basic Red 9 as the basic dye, acrylic acid as the ethylenically unsaturated monomer having a carboxyl group, and/or styrene as the ethylenically unsaturated monomer having an aromatic functional group.

In an alternative embodiment, the respective reactants for preparation of the polymeric dye compound may be selected independently as below: methacryloyl chloride used as the acyl chloride group-containing ethylenically unsaturated monomer, Basic Red 29 as the basic dye, methacrylic acid as the ethylenically unsaturated monomer having a carboxyl group, and/or α-methyl styrene as the ethylenically unsaturated monomer having an aromatic functional group.

In another alternative embodiment, the respective reactants for preparation of the polymeric dye compound may be selected independently as below: methacryloyl chloride used as the acyl chloride group-containing ethylenically unsaturated monomer, Basic Blue 11 as the basic dye, α-chloroacrylic acid as the ethylenically unsaturated monomer having a carboxyl group, and/or o-vinyl toluene as the ethylenically unsaturated monomer having an aromatic functional group.

In another exemplary embodiment, the respective reactants for preparation of the polymeric dye compound may be selected independently as below: acryloyl chloride used as the acyl chloride group-containing ethylenically unsaturated monomer, Basic Red 9 as the basic dye, maleic anhydride as the ethylenically unsaturated monomer having a carboxylic anhydride structure, and/or styrene as the ethylenically unsaturated monomer having an aromatic functional group.

The present invention also provides a photosensitive resin composition comprising the polymeric dye compound. The composition comprises: colorant, 10-500 parts by weight (pbw), for example, 10 pbw, 20 pbw, 30 pbw, 40 pbw, 50 pbw, 60 pbw, 70 pbw 80 pbw, 100 pbw, 150 pbw, 200 pbw, 250 pbw, 300 pbw, 350 pbw, 400 pbw, 450 pbw, 500 pbw, etc.; alkali-soluble resin, 5-60 pbw, for example, 5 pbw, 10 pbw, 20 pbw, 30 pbw, 40 pbw, 50 pbw, 60 pbw, etc.; polymerizable monomer, 5-60 pbw, for example, 5 pbw, 10 pbw, 20 pbw, 30 pbw, 40 pbw, 50 pbw, 60 pbw, etc.; photoinitiator, 0.1-30 pbw, for example, 0.1 pbw, 0.5 pbw, 1 pbw, 5 pbw, 10 pbw, 20 pbw, 30 pbw, etc.; and, optionally, solvent, 50-3000 pbw, for example, 50 pbw, 100 pbw, 200 pbw, 300 pbw, 400 pbw, 500 pbw, 600 pbw, 700 pbw, 800 pbw, 800 pbw, 1000 pbw, 2000 pbw, 3000 pbw, etc. Preferably, the photosensitive resin composition comprises: colorant, 20-400 pbw; alkali-soluble resin, 10-50 pbw; polymerizable monomer, 10-50 pbw; photoinitiator, 0.1-20 pbw; and, optionally, solvent, 300-1500 pbw.

In an embodiment, the photosensitive resin composition comprises: colorant, 10-80 pbw; alkali-soluble resin, 10-60 pbw; polymerizable monomer, 10-60 pbw; photoinitiator, 1-30 pbw; and, optionally, solvent, 50-1000 pbw.

In another embodiment, the photosensitive resin composition comprises: colorant, 20-60 pbw; alkali-soluble resin, 10-50 pbw; polymerizable monomer, 10-50 pbw; photoinitiator, 1-20 pbw; and, optionally, solvent, 300-700 pbw.

Preferably, in the photosensitive resin composition, the colorant comprises the polymeric dye compound and a pigment in a weight ratio ranging from 100:1 to 1:100, for example, 100:1, 100:20, 100:40, 100:80, 100:100, 80:100, 60:100, 40:100, 20:100, 10:100, 8:100, 6:100, 4:100, 2:100 or 1:100, preferably from 100:40 to 40:100.

The pigment is an organic pigment, an inorganic pigment, or a pigment dispersion. Particularly, the organic pigment includes, for example, materials with the following color index labels:

red pigments, primarily including perylenes, quinacridones, pyrrolopyrroles, such as P.R.224, P.R.254, P.R.255, P.R.264, P.R.122, P.R.123, P.R.177, P.R.179, P.R.190, P.R.202, P.R.210, P.R.270, P.R.272, P.R.122, C.I. Pigment Red 254, etc.;

blue pigments, such as P.B.1, P.B.2, P.B.15, P.B.15:3, P.B.15:4, P.B.15:6, P.B.16, P.B.22, P.B.60, P.B.66, etc.;

violet pigments, such as P.V.32, P.V.36, P.V.38, P.V.39, P.V.23, P.V.9, P.V.1, etc.; and yellow pigments, including azo pigments and heterocyclic pigments, such as P.Y.1, P.Y.12, P.Y.3, P.Y.13, P.Y.83, P.Y.93, P.Y.94, P.Y.95, P.Y.109, P.Y.126, P.Y.127, P.Y.138, P.Y.139, P.Y.147, P.Y.150, P.Y.174, etc.

The pigment dispersion is commercially available or may be prepared according to any process known in the prior art. An exemplary formulation of the pigment dispersion is as follows: C.I. Pigment Red, 8-15 pbw; acrylic resin, 15-25 pbw; a resinous dispersant, 20-25 pbw; and solvent, 40-50 pbw, wherein the C.I. Pigment Red is C.I. Pigment Red 254, C.I. Pigment Red 177 or C.I. Pigment Red 150. Such a pigment dispersion may be prepared by uniformly mixing the components of the formulation, dispersing the resultant mixture in a mill for 5 hours in the presence of zirconia beads having a diameter of 0.5 mm, and then filtering the resultant dispersion through a filter having pores of 5.0 μm.

Preferably, the alkali-soluble resin is a (meth)acrylic resin, which may be a copolymer of methacrylic acid and another double bond-containing compound, or a terpolymer or multipolymer of methacrylic acid and two or more kinds of other double bond-containing compounds. Preferably, the alkali-soluble resin is a copolymer of methacrylic acid and methacrylate.

The polymerizable monomer may be an acrylate monomer. Particularly, the polymerizable monomer may be selected from pentaerythritol triacrylate, dipentaerythritol triacrylate, pentaerythritol tetraacrylate, dipentaerythritol tetraacrylate, dipentaerythritol pentaacrylate, dipentaerythritol hexaacrylate, etc.

The photoinitiator may be a diimidazole-based compound, benzoin-based compound, polynuclear quinone-based compound, benzophenone-based compound, acetophenone-based compound, triazine-based compound, diazo-based compound, xanthone-based compound, oxime ester-based compound, iodonium salt, or sulfonium salt, or combinations of two or more thereof. The acetophenone-based compound is preferably 2-(4-methylbenzyl)-2-(dimethylamino)-1-(4-morpholinophenyl)-1-butanone, or 2-methyl-1-[4-(methylthio)phenyl]-2-(4-morpholinyl)-1-propanone. The oxime ester-based compound is preferably a 1-[4-(phenylthio)phenyl]-1,2-octanedione 2-(O-benzoyloxime), etc.

The solvent may be one selected from propylene glycol methyl ether acetate, diethylene glycol diethyl ether, ethyl 3-ethoxypropionate, and propylene glycol methyl ether, or a mixture of at least two thereof.

The present invention also provides a method of preparing the photosensitive resin composition, comprising the following steps: weighing the respective components of the composition, and mixing the components uniformly, followed by filtering the resultant mixture. The filtering operation may be carried out by using a filter having pores with a diameter of 0.5 μm.

Also provided is a color filter which comprises the photosensitive resin composition of the present invention. Thus, the color filter also comprises the polymeric dye compound of the present invention.

The present invention can provide the advantages as described below.

The polymeric dye compound of the present invention has a higher transmittance than traditional pigments, and meanwhile, it has superior heat resistance, light resistance, and solvent resistance due to the phenyl group comprised in the structure thereof.

The photosensitive resin composition comprises, among others, a colorant and an alkali-soluble resin. The colorant comprises the polymeric dye compound and a pigment, wherein the polymeric dye compound is prepared by reacting an acyl chloride group-containing ethylenically unsaturated monomer with an amine or amino group-containing basic dye to produce an amide compound, and then copolymerizing the amide compound with an ethylenically unsaturated monomer having an aromatic functional group, and an ethylenically unsaturated monomer having one or more carboxyl groups or carboxylic anhydride structures.

A dispersant may be used to disperse the pigment uniformly. The dispersant may be a pigment wetting and dispersing agent known in the art, such as BYK, Solsperse, EFKA, Ajinomoto, Shin-Nakamura, etc. Based on solid content, the dispersant is present in an amount of 20-60% relative to the pigment.

The colorant according to the present invention is comprised of the polymeric dye compound and a pigment. Due to the combination of the pigment and the polymeric dye compound, superior heat resistance, light resistance, solvent resistance and high transmittance can be achieved simultaneously.

The alkali-soluble resin may be selected from (meth)acrylic resins, preferably a copolymer of (meth)acrylic acid, (meth)acrylate and optionally other double bond-containing compound(s). For example, suitable alkali-soluble resins include ACA series from Cytec chemical, such as ACAZ300, ACAZ250, etc.; and a mixture B1 of V259ME and V301ME (trade names) in a weight ratio of 52.9:47.1, available from Nippon Steel Chemical Co., Ltd.

The resultant colorant is mixed with an alkali-soluble resin, a polymerizable monomer and a photoinitiator to form a color photoresist. After the color photoresist is coated, prebaked, exposed to light, developed and post-baked, a color filter having excellent color characteristics, heat resistance, light resistance and solvent resistance can be obtained.

The colorant according to the present invention combines a pigment with the polymeric dye compound comprising an amine or amino-group containing basic dye bonded to a polymeric compound. Thus, a color filter having a high brightness, wide color reproduction area, as well as excellent heat resistance and light resistance can be obtained.

The polymeric dye compound comprising a styrene group is useful for forming a colored layer of a color filter, and particularly, a colored layer having an excellent heat resistance and light resistance, as well as high transmittance, which is superior to the prior art.

The features or elements of the respective aspects and embodiments of the present invention described herein can be combined with each other. The complete disclosures of the patent documents and publications cited herein are incorporated by reference in their entirety as if each were individually incorporated.

As used in this specification and the appended claims, the singular forms "a", "an", and "the" include plural referents unless the content clearly dictates otherwise. Thus, for example, reference to a composition containing "a compound" includes a mixture of two or more compounds.

Unless otherwise indicated, all numbers expressing quantities of ingredients and measurement of properties used in the specification and claims are to be understood as being modified in all instances by the term "about". Accordingly, unless indicated to the contrary, the numerical parameters set forth in the foregoing specification and attached claims are approximations that can vary depending upon the desired properties sought to be obtained by those skilled in the art utilizing the teachings of the present invention. At the very least, and not as an attempt to limit the application of the doctrine of equivalents to the scope of the claims, each numerical parameter should at least be construed in light of the number of reported significant digits and by applying ordinary rounding techniques. In addition, the recitation of numerical ranges by endpoints includes all subsets and numbers subsumed within that range (e.g. 5 to 10 includes 5, 6, 7.5, 9, 10, 6-7, etc.).

EXAMPLES

The following examples are given for the purpose of illustrating the present invention, but the invention is not limited thereto.

Preparation Example 1

Preparation of Pigment Dispersions PM-1 to PM-3

Pigment dispersions PM-1, PM-2 and PM-3 were prepared with reference to CN 102253599 B. The mixtures shown in the following table were uniformly mixed under stirring, dispersed in a mill (DYNO-MILL RESEARCH LAB, from WAB Machinery Co., Ltd.) for 5 hours in the presence of zirconia beads having a diameter of 0.5 mm, and then filtered through a filter having pores of 5.0 μm to give the pigment dispersions.

| Pigment dispersion | Pigment powder | Acrylic resin | Resinous dispersant | Solvent |
| --- | --- | --- | --- | --- |
| PM-1 | C.I. Pigment Red 254 11 pbw | ACA Z251 20 pbw | EFKA4300 21 pbw | Propylene glycol methyl ether acetate 48 pbw |
| PM-2 | C.I. Pigment Red 177 11 pbw | ACA Z251 20 pbw | EFKA4300 21 pbw | Propylene glycol methyl ether acetate 48 pbw |
| PM-3 | C.I. Pigment Yellow 150 11 pbw | ACA Z251 20 pbw | EFKA4300 21 pbw | Propylene glycol methyl ether acetate 48 pbw |

In the following formulations of the respective photosensitive resin compositions prepared in the Examples (Ex.) and Comparative examples (CEX.), the amounts of the pigment dispersions PM-1, PM-2 and PM-3 are each reported as parts by weight of solid content thereof.

The alkali-soluble resin ACAZ300, a copolymer of methacrylic acid and methacrylate, was obtained from Cytec chemical.

The polymerizable monomer used, i.e., dipentaerythritol pentaacrylate (DPHA), was obtained from TOAGOSEI CO., LTD.

The photoinitiator OXE01, i.e., 1-[4-(phenylthio)phenyl]-1,2-octanedione 2-(O-benzoyloxime), was obtained from BASF Chemical Co., Ltd.

The solvent used, i.e., propylene glycol methyl ether acetate (PMA), was obtained from DOW Chemical.

Example 1

Synthesis of Polymeric Dye Compound a

1. To a three-necked flask containing methacryloyl chloride (10.45 g, 0.1 mol) was added 63.8 mL triethylamine, followed by the addition of Basic Red 9 (32.38 g, 0.1 mol). The mixture was reacted for 3 h, then filtered, and rotary evaporated to produce an amide compound, trimethacrylamide Basic Red 9.

2. A 1000 mL four-necked Erlenmeyer flask was provided with a nitrogen inlet, a stirrer, a heater, a condenser and a thermometer. With nitrogen gas being introduced into the flask, the components (i.e., the amide compound obtained in step 1 (0.1 mol), methacrylic acid monomer (0.35 mol), styrene monomer (0.3 mol), and the solvent ethyl 3-ethoxypropionate (EEP) 200 ml) were add in a batch under stirring. Then, with the contents of the flask being stirred, the temperature was increased to 100° C. by an oil bath. The polymerization initiator 2,2'-azobis-2-methylbutyronitrile (0.02 mol) was dissolved in 200 mL organic solvent EEP (solvent:polymerization initiator=20:5 (v/w)), and was divided into five batches (i.e., the solution of 2,2'-azobis-2-methylbutanenitrile (4 g) in EEP was divided into five equal portions), each being added to the flask every other hour.

The reaction temperature of the polymerization process was maintained at 100° C., and the polymerization was conducted for 6 h. After completion of the polymerization, the polymer solution was added with 200 g toluene under stirring and washed to precipitate a polymer, and then was subjected to centrifugal filtration to give the polymeric dye compound a.

Example 2

Synthesis of Polymeric Dye Compound b

The polymeric dye compound b was synthesized according to the process of the polymeric dye compound a, with the exception that 0.3 mol o-vinyl toluene was used instead of the styrene monomer.

Example 3

Synthesis of Polymeric Dye Compound c

The polymeric dye compound c was synthesized according to the process of the polymeric dye compound a, with the exception that 20 g Basic Red 29 was used instead of the Basic Red 9.

Test Example 1

Measurements of Acid Value and Weight-average Molecular Weight (Mw)

The acid values and weight-average molecular weights (Mw) of Examples 1, 2 and 3 were measured by the following processes.

Mw of each polymeric dye compound was measured by GPC (HLC-8120GPC, manufactured by Tosoh Corp.), with THF as a developing solvent. The GPC was loaded with a TSK gel column (Tosoh Corp.) and connected to a RI detector. The Mw was determined according to polystyrene standards.

The acid value of each polymeric dye compound having pendant acidic groups was measured by titration with KOH, using phenolphthalein as an indicator.

The test results are reported in Table 1 below.

TABLE 1 test results of acid value and Mw of the respective compounds

|  | Example 1 | Example 2 | Example 3 |
| --- | --- | --- | --- |
| Mw | 8K | 9K | 7K |
| Acid value | 80 mg/g | 85 mg/g | 80 mg/g |

The results in Table 1 show that the polymer dye compounds provided by the present invention have a Mw in the range of 7-9K, and an acid value in the range of 80-85 mg/g.

Example 4

Photosensitive Resin Composition

1. Composition:

| Composition | Ingredient | Weight (g) |
| --- | --- | --- |
| Colorant | Polymeric dye compound a | 20 |
|  | PM-1 | 13 |
|  | PM-3 | 2 |
| Alkali-soluble resin | Alkali-soluble resin ACAZ300 | 30 |
| Polymerizable monomer | DPHA | 30 |
| Photoinitiator | OXE01 | 5 |
| Solvent | PMA | 1000 |

2. Preparation process: the above ingredients were placed in a beaker and uniformly mixed with stirring for 2 h, followed by filtering through a filter having pores of 0.5 μm to give the photosensitive resin composition.

Example 5

Photosensitive Resin Composition

1. Composition:

| Composition | Ingredient | Weight (g) |
|---|---|---|
| Colorant | Polymeric dye compound a | 15 |
|  | PM-1 | 18 |
|  | PM-3 | 2 |
| Alkali-soluble resin | Alkali-soluble resin ACAZ300 | 30 |
| Polymerizable monomer | DPHA | 30 |
| Photoinitiator | OXE01 | 5 |
| Solvent | PMA | 1000 |

2. The preparation process was identical to that of Example 4.

Example 6

Photosensitive Resin Composition

1. Composition:

| Composition | Ingredient | Weight (g) |
|---|---|---|
| Colorant | Polymeric dye compound a | 10 |
|  | PM-1 | 23 |
|  | PM-3 | 2 |
| Alkali-soluble resin | Alkali-soluble resin ACAZ300 | 30 |
| Polymerizable monomer | DPHA | 30 |
| Photoinitiator | OXE01 | 5 |
| Solvent | PMA | 1000 |

2. The preparation process was identical to that of Example 4.

Example 7

Photosensitive Resin Composition

1. Composition:

| Composition | Ingredient | Weight (g) |
|---|---|---|
| Colorant | Polymeric dye compound b | 20 |
|  | PM-1 | 13 |
|  | PM-3 | 2 |
| Alkali-soluble resin | Alkali-soluble resin ACAZ300 | 30 |
| Polymerizable monomer | DPHA | 30 |
| Photoinitiator | OXE01 | 5 |
| Solvent | PMA | 1000 |

2. The preparation process was identical to that of Example 4.

Example 8

Photosensitive Resin Composition

1. Composition:

| Composition | Ingredient | Weight (g) |
|---|---|---|
| Colorant | Polymeric dye compound c | 20 |
|  | PM-1 | 13 |
|  | PM-3 | 2 |
| Alkali-soluble resin | Alkali-soluble resin ACAZ300 | 30 |
| Polymerizable monomer | DPHA | 30 |
| Photoinitiator | OXE01 | 5 |
| Solvent | PMA | 1000 |

2. The preparation process was identical to that of Example 4.

Comparative Example 1

1. Composition:

| Composition | Ingredient | Weight (g) |
|---|---|---|
| Colorant | PM-1 | 17.5 |
|  | PM-2 | 15.5 |
|  | PM-3 | 2 |
| Alkali-soluble resin | Alkali-soluble resin ACAZ300 | 30 |
| Polymerizable monomer | DPHA | 30 |
| Photoinitiator | OXE01 | 5 |
| Solvent | PMA | 1000 |

2. The preparation process was identical to that of Example 4.

Comparative Example 2

1. Composition:

| Composition | Ingredient | Weight (g) |
|---|---|---|
| Colorant | Basic Red 9 | 35 |
| Alkali-soluble resin | Alkali-soluble resin ACAZ300 | 30 |
| Polymerizable monomer | DPHA | 30 |
| Photoinitiator | OXE01 | 5 |
| Solvent | PMA | 1000 |

2. The preparation process was identical to that of Example 4.

Test Example 2

Evaluation of Performances

1. The photosensitive resin compositions of Examples 4-8 and the formulations of Comparative examples 1-2 were respectively mixed uniformly, coated, exposed to light and developed. The properties were evaluated by the following methods.

1) Sensitivity: UV irradiation was performed at 365 nm with an intensity of 10 mW/cm$^2$ in the presence of a pattern mask having a minimum accuracy of 3 μm, followed by development with 0.042% aqueous KOH solution at 23° C. for 40 seconds (s), and then washed with pure water for 1 minute (min).

2) Resolution: resolution was determined as the minimum size of the patterned film formed during the aforesaid sensitivity measurement 1).

3) Transmittance: transmittance of the patterned film was measured using a spectrophotometer at 400 nm.
2. Results are reported in Table 2.

TABLE 2

Evaluation of performances

| Examples | Sensitivity (mJ/cm$^2$) | Resolution (μm) | Transmittance (%) | Color difference after post-Baking, ΔEab | Color difference after UV irradiation for 48 h, ΔEab |
|---|---|---|---|---|---|
| Ex. 4 | 150 | 3 | 35 | 0.48 | 0.35 |
| Ex. 5 | 150 | 3 | 30 | 0.52 | 0.43 |
| Ex. 6 | 150 | 3 | 25 | 0.55 | 0.45 |
| Ex. 7 | 150 | 3 | 35 | 0.30 | 0.28 |
| Ex. 8 | 150 | 3 | 35 | 0.53 | 0.53 |
| CEX. 1 | 150 | 3 | 20 | 0.38 | 0.38 |
| CEX. 2 | 150 | 3 | 50 | 5.0 | 5.6 |

From the results in Table 2, it can be seen that

Examples 4-8 exhibited sensitivity and resolution identical to those of Comparative examples 1-2, but they exhibited transmittance higher than that of Comparative example 1, demonstrating that the polymeric dye compounds of the present invention can improve the transmittance of the resultant color filters; and Comparative example 2 exhibited significant color difference after post-baking and after a prolonged UV irradiation, while Examples 4-8 comprising the polymeric dye compounds of the present invention exhibited few color difference, demonstrating that the polymeric dye compounds of the present invention have excellent thermal stability and photostability, that is, they have superior heat resistance and light resistance.

The results indicate that the photosensitive resin compositions of the present invention exhibit better sensitivity and resolution after development, and provide colored layers with excellent heat resistance and light resistance, as well as high transmittance, which are superior to the prior art.

Preparation Example 2

Preparation of Pigment Dispersions PM-4 to PM-6

Pigment dispersions PM-4, PM-5 and PM-6 were prepared in the same manner as described above in Preparation Example 1, except the composition of the respective dispersions shown in the table below:

| Pigment dispersion | Pigment powder | Acrylic resin | Resinous dispersant | Solvent |
|---|---|---|---|---|
| PM-4 | C.I. Pigment Red 254 15 pbw | ACA Z251 5 pbw | EFKA4300 3 pbw | Propylene glycol methyl ether acetate 77 pbw |
| PM-5 | C.I. Pigment Red 177 15 pbw | ACA Z251 5 pbw | EFKA4300 3 pbw | Propylene glycol methyl ether acetate 77 pbw |
| PM-6 | C.I. Pigment Yellow 150 15 pbw | ACA Z251 5 pbw | EFKA4300 3 pbw | Propylene glycol methyl ether acetate 77 pbw |

In the following formulations of the respective photosensitive resin compositions prepared in the Examples and Comparative examples, the amounts of the pigment dispersions PM-4, PM-5 and PM-6 are each reported as parts by weight of solid content thereof.

Examples 9-13

Photosensitive Resin Compositions

Photosensitive resin compositions of Examples 9-13 were prepared in the same manner as described above in Examples 4-8, except the formulation of the respective compositions shown in the tables below:

Photosensitive resin composition of Example 9

| Composition | Ingredient | Weight (g) |
|---|---|---|
| Colorant | Polymeric dye compound a | 20 |
|  | PM-4 | 13 |
|  | PM-6 | 2 |
| Alkali-soluble resin | Alkali-soluble resin ACAZ300 | 30 |
| Polymerizable monomer | DPHA | 30 |
| Photoinitiator | OXE01 | 5 |
| Solvent | PMA | 1000 |

Photosensitive resin composition of Example 10

| Composition | Ingredient | Weight (g) |
|---|---|---|
| Colorant | Polymeric dye compound a | 15 |
|  | PM-4 | 18 |
|  | PM-6 | 2 |
| Alkali-soluble resin | Alkali-soluble resin ACAZ300 | 30 |
| Polymerizable monomer | DPHA | 30 |
| Photoinitiator | OXE01 | 5 |
| Solvent | PMA | 1000 |

Photosensitive resin composition of Example 11

| Composition | Ingredient | Weight (g) |
|---|---|---|
| Colorant | Polymeric dye compound a | 10 |
|  | PM-4 | 23 |
|  | PM-6 | 2 |
| Alkali-soluble resin | Alkali-soluble resin ACAZ300 | 30 |
| Polymerizable monomer | DPHA | 30 |
| Photoinitiator | OXE01 | 5 |
| Solvent | PMA | 1000 |

Photosensitive resin composition of Example 12

| Composition | Ingredient | Weight (g) |
|---|---|---|
| Colorant | Polymeric dye compound b | 20 |
|  | PM-4 | 13 |
|  | PM-6 | 2 |
| Alkali-soluble resin | Alkali-soluble resin ACAZ300 | 30 |
| Polymerizable monomer | DPHA | 30 |
| Photoinitiator | OXE01 | 5 |
| Solvent | PMA | 1000 |

Photosensitive resin composition of Example 13

| Composition | Ingredient | Weight (g) |
|---|---|---|
| Colorant | Polymeric dye compound c | 20 |
|  | PM-4 | 13 |
|  | PM-6 | 2 |
| Alkali-soluble resin | Alkali-soluble resin ACAZ300 | 30 |
| Polymerizable monomer | DPHA | 30 |
| Photoinitiator | OXE01 | 5 |
| Solvent | PMA | 1000 |

Comparative examples 3-4

Photosensitive resin compositions of Comparative examples 3-4 were prepared in the same manner as described above in Comparative examples 1-2, except the formulation of the respective compositions shown in the tables below:

Composition of Comparative Example 3

| Composition | Ingredient | Weight (g) |
| --- | --- | --- |
| Colorant | PM-4 | 17.5 |
| | PM-5 | 15.5 |
| | PM-6 | 2 |
| Alkali-soluble resin | Alkali-soluble resin ACAZ300 | 30 |
| Polymerizable monomer | DPHA | 30 |
| Photoinitiator | OXE01 | 5 |
| Solvent | PMA | 1000 |

Composition of Comparative Example 4

| Composition | Ingredient | Weight (g) |
| --- | --- | --- |
| Colorant | Basic Red 9 | 35 |
| Alkali-soluble resin | Alkali-soluble resin ACAZ300 | 30 |
| Polymerizable monomer | DPHA | 30 |
| Photoinitiator | OXE01 | 5 |
| Solvent | PMA | 1000 |

Test Example 3

Evaluation of Performances

Evaluation of performances was performed in the same manner as described above in Test example 2. Results are reported in Table 3 below.

TABLE 3

| | Evaluation of performances | | | | |
| --- | --- | --- | --- | --- | --- |
| Examples | Sensitivity (mJ/cm$^2$) | Resolution (μm) | Transmittance (%) | Color difference after post-Baking, ΔEab | Color difference after UV irradiation for 48 h, ΔEab |
| Ex. 9 | 150 | 3 | 32 | 0.50 | 0.38 |
| Ex. 10 | 150 | 3 | 27 | 0.52 | 0.46 |
| Ex. 11 | 150 | 3 | 25 | 0.58 | 0.48 |
| Ex. 12 | 150 | 3 | 32 | 0.35 | 0.33 |
| Ex. 13 | 150 | 3 | 32 | 0.55 | 0.55 |
| CEX. 3 | 150 | 3 | 18 | 0.30 | 0.35 |
| CEX. 4 | 150 | 3 | 50 | 5.0 | 5.6 |

The results also indicate that the photosensitive resin compositions of the present invention exhibit better sensitivity and resolution after development, and provide colored layers with excellent heat resistance and light resistance, as well as high transmittance, which are superior to the prior art.

It should be understood that the above embodiments of the invention have been disclosed only for illustrating the principle of the present invention, but they are not intended to limit the present invention. Obviously, the person skilled in the art can make various modifications and variations of the invention without departing from the spirit and scope of the invention, thus the modifications and variations of the invention are included within the scope of the present invention.

The invention claimed is:

1. A polymeric dye compound useful for forming a colored layer of a color filter, comprising monomeric units (A), (B) and (C) represented by the following structural formulae:

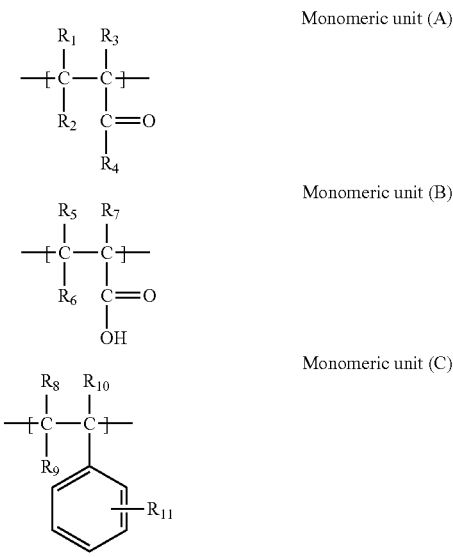

wherein:
$R_1$, $R_2$, $R_3$, $R_8$, $R_9$, $R_{10}$ and $R_{11}$ each independently represent hydrogen, halogen, C1-C12 alkyl, C3-C12 cycloalkyl, or C6-C12 aromatic hydrocarbyl;
$R_4$ is a group derived from a basic dye and connected to the monomeric unit (A) via a nitrogen atom, the basic dye is selected from the group consisting of Basic Red 9, Basic Red 29, Basic Blue 11, Basic Blue 17, Basic Blue 26, Basic Red 2 and Basic Violet 2;
$R_5$, $R_6$ and $R_7$ each independently represent hydrogen, halogen, carboxyl, C1-C12 alkyl, or carboxyalkyl, and the carboxyl group contained in $R_5$, $R_6$ or $R_7$, if any, optionally forms a carboxylic anhydride structure with the carboxyl group present in the structural formula of the monomeric monomer (B); and
the sum of the monomeric units (A), (B) and (C) is in the range of 80-100 mol %, based on the total monomeric units of the polymeric dye compound, and
wherein the polymeric dye compound has a weight-average molecular weight (Mw) in the range of 7,000-9,000 and an acid value of 80-120 mg/g.

2. The polymeric dye compound according to claim 1, characterized in that the molar ratio of the monomeric units (A):(B):(C) is 1:1-10:1-10.

3. The polymeric dye compound according to claim 1, characterized in that the polymeric dye compound satisfies one or more selected from the group consisting of the following:
$R_1$, $R_2$, $R_3$, $R_5$, $R_6$, $R_7$, $R_8$, $R_9$, $R_{10}$ and $R_{11}$ each independently represent hydrogen, chlorine, methyl, ethyl, propyl or cyclohexyl;
$R_4$ is a group derived from Basic Red 9; and
the molar ratio of the monomeric units (A):(B):(C) is 1:1-7:1-5.

4. A method of preparing a polymeric dye compound useful for forming a colored layer of a color filter comprising monomeric units (A), (B) and (C) represented by the following structural formulae:

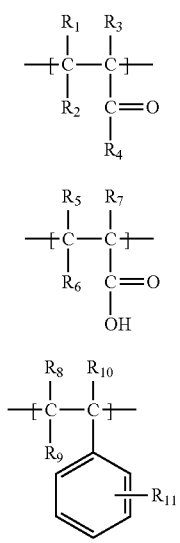

Monomeric unit (A)

Monomeric unit (B)

Monomeric unit (C)

wherein:
$R_1$, $R_2$, $R_3$, $R_8$, $R_9$, $R_{10}$ and $R_{11}$ each independently represent hydrogen, halogen, C1-C12 alkyl, C3-C12 cycloalkyl, or C6-C12 aromatic hydrocarbyl;
$R_4$ is a group derived from a basic dye and connected to the monomeric unit (A) via a nitrogen atom, the basic dye is selected from the group consisting of Basic Red 9, Basic Red 29, Basic Blue 11, Basic Blue 17, Basic Blue 26, Basic Red 2 and Basic Violet 2;
$R_5$, $R_6$ and $R_7$ each independently represent a hydrogen, halogen, carboxyl, C1-C12 alkyl, or carboxyalkyl, and the carboxyl group contained in $R_5$, $R_6$ or $R_7$, if any, optionally forms a carboxylic anhydride structure with the carboxyl group present in the structural formula of the monomeric monomer (B); and
the sum of the monomeric units (A), (B) and (C) is in the range of 80-100 mol %, based on the total monomeric units of the polymeric dye compound, and
wherein the polymeric dye compound has a weight-average molecular weight (Mw) in the range of 7,000-9,000 and an acid value of 80-120 mg/g;
characterized in that the method comprises the following steps:
1) dissolving and reacting an acyl chloride group-containing ethylenically unsaturated monomer and the basic dye in a non-reactive organic solvent to produce an amide compound; and
2) mixing the amide compound obtained in step 1), an ethylenically unsaturated monomer having a carboxyl group or a carboxylic anhydride structure, an ethylenically unsaturated monomer having an aromatic functional group and a solvent under stirring, followed by the addition of a radical polymerization initiator to initiate a polymerization reaction, thereby producing the polymeric dye compound.

5. The method according to claim 4, characterized in that step 1) satisfies one or more selected from the group consisting of the following:
reacting the acyl chloride group-containing ethylenically unsaturated monomer and the basic dye at a molar ratio in the range of 3:1-1:3;
the acyl chloride group-containing ethylenically unsaturated monomer is selected from acryloyl chloride, methacryloyl chloride, or derivatives thereof;
the non-reactive organic solvent is triethylamine;
the reaction is performed at a temperature in the range of 5-20° C.;
the reaction is performed for 2-5 hours; and
filtration and rotary evaporation are performed after completion of the reaction.

6. The method according to claim 4, characterized in that the polymerization reaction of step 2) satisfies one or more selected from the group consisting of the following:
the molar ratio of the amide compound: the ethylenically unsaturated monomer having a carboxyl group or a carboxylic anhydride structure: the ethylenically unsaturated monomer having an aromatic functional group is in the range of 1:1-10:1-10;
the ratio of the volume of the solvent to the total weight of the amide compound, the ethylenically unsaturated monomer having a carboxyl group or a carboxylic anhydride structure and the ethylenically unsaturated monomer having an aromatic functional group ranges from 10:1 to 1:10 ml/g;
the weight ratio of the radical polymerization initiator to the total of the amide compound, the ethylenically unsaturated monomer having a carboxyl group or a carboxylic anhydride structure and the ethylenically unsaturated monomer having an aromatic functional group ranges from 0.1% to 5%;
the radical polymerization initiator is added as a solution in the solvent;
the polymerization reaction is performed at a temperature in the range of 50-120° C.;
the polymerization reaction is performed for 5-10 hours;
washing and filtration are performed after completion of the polymerization reaction;
the ethylenically unsaturated monomer having a carboxyl group or a carboxylic anhydride structure is an ethylenic monocarboxylic acid, an ethylenic dicarboxylic acid or anhydride thereof, or an ethylenic polycarboxylic acid or anhydride thereof;
the ethylenically unsaturated monomer having an aromatic functional group is styrene, α-methyl styrene, o-vinyl toluene, p-vinyl toluene or m-vinyl toluene;
the solvent is one selected from ethylene glycol methyl ether, propylene glycol methyl ether, propylene glycol methyl ether acetate and ethyl 3-ethoxypropionate, or a mixture of at least two thereof; and
the radical polymerization initiator is 2,2'-azobisisobutyronitrile or dibenzoyl peroxide.

7. The method according to claim 4, characterized in that the polymerization reaction of step 2) satisfies one or more selected from the group consisting of the following:
the molar ratio of the amide compound: the ethylenically unsaturated monomer having a carboxyl group or a carboxylic anhydride structure: the ethylenically unsaturated monomer having an aromatic functional group is in the range of 1:1-7:1-5;
the ethylenically unsaturated monomer having a carboxyl group or a carboxylic anhydride structure is selected from the group consisting of acrylic acid, methacrylic acid, crotonic acid, α-chloroacrylic acid, cinnamic acid, maleic acid or anhydride thereof, fumaric acid or anhydride thereof, itaconic acid or anhydride thereof, and citraconic acid or anhydride thereof;
the solvent is ethyl 3-ethoxypropionate;
the initiator is added in 2-5 batches; and
after completion of the polymerization reaction, the method further comprises washing with toluene, followed by filtration.

8. A photosensitive resin composition, characterized in that the composition comprises: colorant, 10-500 parts by weight (pbw); alkali-soluble resin, 5-60 pbw; polymerizable monomer, 5-60 pbw; photoinitiator, 0.1-30 pbw; and, optionally, solvent, 50-3000 pbw;

wherein the colorant comprises a pigment and a polymeric dye compound useful for forming a colored layer of a color filter comprising monomeric units (A), (B) and (C) represented by the following structural formulae:

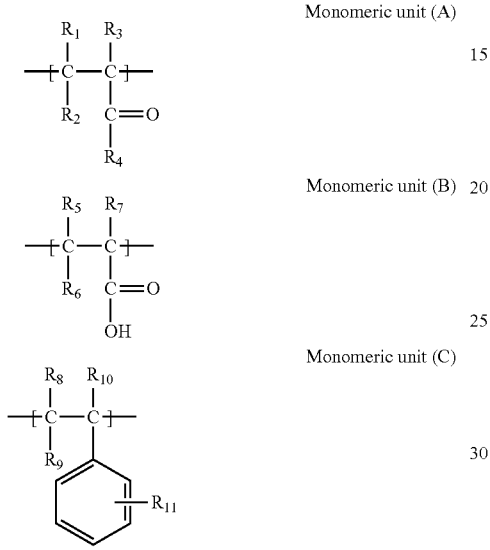

wherein:
$R_1$, $R_2$, $R_3$, $R_8$, $R_9$, $R_{10}$ and $R_{11}$ each independently represent hydrogen, halogen, C1-C12 alkyl, C3-C12 cycloalkyl, or C6-C12 aromatic hydrocarbyl;

$R_4$ is a group derived from a basic dye and connected to the monomeric unit (A) via a nitrogen atom, the basic dye is selected from the group consisting of Basic Red 9, Basic Red 29, Basic Blue 11, Basic Blue 17, Basic Blue 26, Basic Red 2 and Basic Violet 2;

$R_5$, $R_6$ and $R_7$ each independently represent a hydrogen, halogen, carboxyl, C1-C12 alkyl, or carboxyalkyl, and the carboxyl group contained in $R_5$, $R_6$ or $R_7$, if any, optionally forms a carboxylic anhydride structure with the carboxyl group present in the structural formula of the monomeric monomer (B); and the sum of the monomeric units (A), (B) and (C) is in the range of 80-100 mol %, based on the total monomeric units of the polymeric dye compound, and wherein the polymeric dye compound has a weight-average molecular weight (Mw) in the range of 7,000-9,000 and an acid value of 80-120 mg/g.

9. The photosensitive resin composition according to claim 8, characterized in that the composition comprises: colorant, 20-400 pbw; alkali-soluble resin, 10-50 pbw; polymerizable monomer, 10-50 pbw; photoinitiator, 0.3-20 pbw; and, optionally, solvent, 300-1500 pbw.

10. The photosensitive resin composition according to claim 8, characterized in that the composition satisfies one or more selected from the group consisting of the following:
the pigment is an organic pigment, an inorganic pigment, or a pigment dispersion;

the alkali-soluble resin is a copolymer of methacrylic acid and one, two or more kinds of other double bond-containing compounds;

the polymerizable monomer is an acrylate monomer; and the photoinitiator is one selected from a diimidazole-based compound, benzoin-based compound, polynuclear quinone-based compound, benzophenone-based compound, acetophenone-based compound, triazine-based compound, diazo-based compound, xanthone-based compound, oxime ester-based compound, iodonium salt, or sulfonium salt, or a mixture of at least two thereof.

11. The photosensitive resin composition according to claim 8, characterized in that the composition satisfies one or more selected from the group consisting of the following:
the alkali-soluble resin is a copolymer of methacrylic acid and methacrylate;

the polymerizable monomer is selected from pentaerythritol triacrylate, dipentaerythritol triacrylate, pentaerythritol tetraacrylate, dipentaerythritol tetraacrylate, dipentaerythritol pentaacrylate and dipentaerythritol hexaacrylate; and the photoinitiator is an acetophenone-based compound selected from 2-(4- methylbenzyl)-2-(dimethylamino)-1-(4-morpholinophenyl)-1-butanone and 2-methyl-1-[4-(methylthio)phenyl]-2-(4-morpholinyl)-1-propanone, or an oxime ester-based compound of 1[4-(phenylthio)phenyl]-1,2-octanedione 2-(O-benzoyloxime).

12. The photosensitive resin composition according to claim 8, characterized in that the colorant comprises the polymeric dye compound and the pigment in a weight ratio ranging from 100:1 to 1:100.

13. The photosensitive resin composition according to claim 12, characterized in that the colorant comprises the polymeric dye compound and the pigment in a weight ratio ranging from 100:40 to 40:100.

14. The photosensitive resin composition according to claim 8, characterized in that the solvent is one selected from propylene glycol methyl ether acetate, diethylene glycol diethyl ether, ethyl 3-ethoxypropionate, and propylene glycol methyl ether, or a mixture of at least two thereof.

15. A color filter, characterized in that the color filter is comprised of a photosensitive resin composition comprising: colorant, 10-500 parts by weight (pbw); alkali-soluble resin, 5-60 pbw; polymerizable monomer, 5-60 pbw; photoinitiator, 0.1-30 pbw; and, optionally, solvent, 50-3000 pbw;

wherein the colorant comprises a pigment and a polymeric dye compounduseful for forming a colored layer of a color filtercomprising monomeric units (A), (B) and (C) represented by the following structural formulae:

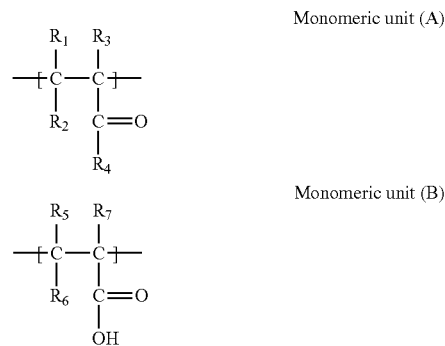

-continued

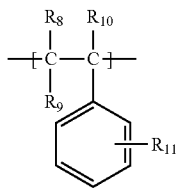

Monomeric unit (C)

wherein:

R₁, R₂, R₃, R₈, R₉, R₁₀ and R₁₁ each independently represent hydrogen, halogen, C1-C12 alkyl, C3-C12 cycloalkyl, or C6-C12 aromatic hydrocarbyl;

R₄ is a group derived from a basic dye and connected to the monomeric unit (A) via a nitrogen atom, the basic dye is selected from the group consisting of Basic Red 9, Basic Red 29, Basic Blue 11, Basic Blue 17, Basic Blue 26, Basic Red 2 and Basic Violet 2;

R₅, R₆ and R₇ each independently represent a hydrogen, halogen, carboxyl, C1-C12 alkyl, or carboxyalkyl, and the carboxyl group contained in R₅, R₆ or R₇, if any, optionally forms a carboxylic anhydride structure with the carboxyl group present in the structural formula of the monomeric monomer (B); and the sum of the monomeric units (A), (B) and (C) is in the range of 80-100 mol %, based on the total monomeric units of the polymeric dye compound, and wherein the polymeric dye compound has a weight-average molecular weight (Mw) in the range of 7,000-9,000 and an acid value of 80-120 mg/g.

16. The color filter according to claim 15, characterized in that the colorant comprises the polymeric dye compound and the pigment in a weight ratio ranging from 100:1 to 1:100.

* * * * *